(12) United States Patent
Tsai et al.

(10) Patent No.: US 9,680,132 B1
(45) Date of Patent: Jun. 13, 2017

(54) DISPLAY DEVICE AND OPTICAL FILM

(71) Applicants: Industrial Technology Research Institute, Hsinchu (TW); University of Central Florida Research Foundation, Inc., Orlando, FL (US)

(72) Inventors: Yi-Shou Tsai, Taipei (TW); Kuo-Chang Lee, Pingtung County (TW); Shin-Tson Wu, Orlando, FL (US); Guan-Jun Tan, Anhui (CN); Rui-Dong Zhu, Jiangsu (CN)

(73) Assignees: Industrial Technology Research Institute, Hsinchu (TW); University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 14/954,933

(22) Filed: Nov. 30, 2015

(51) Int. Cl.
*H01L 51/52* (2006.01)

(52) U.S. Cl.
CPC ...... *H01L 51/5284* (2013.01); *H01L 51/5275* (2013.01)

(58) Field of Classification Search
CPC .............. H01L 51/5284; H01L 51/5275
See application file for complete search history.

(56) References Cited

U.S. PATENT DOCUMENTS

| | | | |
|---|---|---|---|
| 5,986,401 A | 11/1999 | Thompson et al. | |
| 6,515,310 B2 | 2/2003 | Yamazaki et al. | |
| 6,608,333 B1 | 8/2003 | Lee et al. | |
| 6,989,280 B2 | 1/2006 | Ko | |
| 7,365,486 B2 | 4/2008 | Lee et al. | |
| 8,076,838 B2 | 12/2011 | Kobayashi | |
| 8,536,781 B2 | 9/2013 | Lee et al. | |
| 2003/0038593 A1 | 2/2003 | Aziz et al. | |
| 2004/0189196 A1 | 9/2004 | Cok | |
| 2004/0206960 A1* | 10/2004 | Nishikawa | H01L 51/5284 257/72 |

(Continued)

FOREIGN PATENT DOCUMENTS

| | | |
|---|---|---|
| CN | 101164010 | 4/2008 |
| CN | 102034935 | 4/2011 |
| TW | 200745664 | 12/2007 |

OTHER PUBLICATIONS

Jung-Bum Kim, et al., "Enhanced light out-coupling from surface plasmonic loss minimized transparent organic light-emitting diodes," Proc. SPIE 8829, Organic Light Emitting Materials and Devices XVII, 88291M, Sep. 27, 2013, pp. 88291M-1-88291M-10.

(Continued)

*Primary Examiner* — Karen Kusumakar
(74) *Attorney, Agent, or Firm* — Jianq Chyun IP Office

(57) ABSTRACT

A display device including a substrate, a light absorption layer, an optical matching layer, a first transparent electrode, a light emitting layer, and a second transparent electrode is provided. The light absorption layer is disposed on the substrate, and the optical matching layer is disposed on the light absorption layer. The first transparent electrode is disposed on the optical matching layer, the light emitting layer is disposed on the first transparent electrode, and the second transparent electrode is disposed on the light emitting layer. An output luminance and a reflectance of ambient light are controlled by adjusting refractive indices of the optical matching layer and the light absorption layer.

13 Claims, 16 Drawing Sheets

400

(56) References Cited

U.S. PATENT DOCUMENTS

2007/0146588 A1* 6/2007 Yang ................. G02F 1/133553
349/113
2009/0257001 A1* 10/2009 Sumida ................ G02B 6/0033
349/65
2010/0207520 A1 8/2010 Zhu et al.
2012/0280612 A1 11/2012 Lee et al.
2015/0325814 A1* 11/2015 Yang ................... H01L 51/5262
257/40

OTHER PUBLICATIONS

Jung-Bum Kim, et al., "Highly Enhanced Light Extraction from Surface Plasmonic Loss Minimized Organic Light-Emitting Diodes," Advanced Materials, vol. 25, Apr. 12, 2013, pp. 3571-3577.
Benjamin S. Mashford, et al., "High-efficiency quantum-dot light-emitting devices with enhanced charge injection," Nature Photonics, vol. 7, May 2013, pp. 407-412.
"Office Action of Taiwan Counterpart Application," issued on Mar. 1, 2017, p. 1-p. 9, in which the listed reference was cited.
Sei-Yong Kim et al., "High contrast flexible organic light emitting diodes under ambient light without sacrificing luminous efficiency," Organic Electronics 13(5), May 2012, pp. 826-832.

* cited by examiner

DISPLAY DEVICE AND OPTICAL FILM

TECHNICAL FIELD

The disclosure relates to a display device and an optical film, and particularly relates to a display device and an optical film having a high ambient contrast ratio.

BACKGROUND

A light emitting diode display is a display element utilizing the self-luminescent characteristics of light emitting materials to display. The luminescent structure of the light emitting diode display mainly includes a pair of electrodes and a light emitting layer. When a current flows through the light emitting layer via an anode and a cathode, electrons and holes are combined in the light emitting layer to generate excitons, so as to generate light beams of different colors based on material characteristics of the light emitting layer.

For a display, the contrast ratio is one of the factors determining the display quality. However, stronger ambient light may result in a lower ambient contrast ratio, and the display quality of the display is thus affected. In the conventional light emitting diode display, a light absorption layer is provided to absorb the ambient light. However, with the light absorption layer provided, a portion of the light beams emitted by the light emitting layer may also be absorbed by the light absorption layer, thus making an output luminance inefficient.

SUMMARY

The disclosure provides a display device capable of providing a high output luminance and a high ambient contrast ratio under a circumstance that reflection of ambient light is controlled.

An embodiment of the disclosure provides a display device including a substrate, a light absorption layer, an optical matching layer, a first transparent electrode, a light emitting layer, and a second transparent electrode. The light absorption layer is disposed on the substrate, and the optical matching layer is disposed on the light absorption layer. The first transparent electrode is disposed on the optical matching layer, the light emitting layer is disposed on the first transparent electrode, and the second transparent electrode is disposed on the light emitting layer.

Another embodiment of the disclosure provides a display device including a substrate, a light absorption layer, a transflective electrode, a light emitting layer, and a transparent electrode. The light absorption layer is disposed on the substrate. The transflective electrode is disposed on the light absorption layer, the light emitting layer is disposed on the transflective electrode, and the transparent electrode is disposed on the light emitting layer. In addition, a transmittance of the transflective electrode is in a range from 40% to 80%.

An embodiment of the disclosure provides a display device, including a substrate, a first transparent electrode, a light emitting layer, a second transparent electrode, an anti-reflection layer, and a light absorption layer. The first transparent electrode is disposed on the substrate. The light emitting layer is disposed on the first transparent electrode. The second transparent electrode is disposed on the light emitting layer. The anti-reflection layer is disposed on the second transparent electrode. The light absorption layer is disposed on the anti-reflection layer.

An embodiment of the disclosure provides a display device including a substrate, a first anti-reflection layer, a first transparent electrode, a light emitting layer, a second transparent electrode, and a light absorption layer. The first anti-reflection layer is disposed on the substrate. The first transparent electrode is disposed on the first anti-reflection layer. The light emitting layer is disposed on the first transparent electrode. The second transparent electrode is disposed on the light emitting layer. The light absorption layer is disposed on the second transparent electrode.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
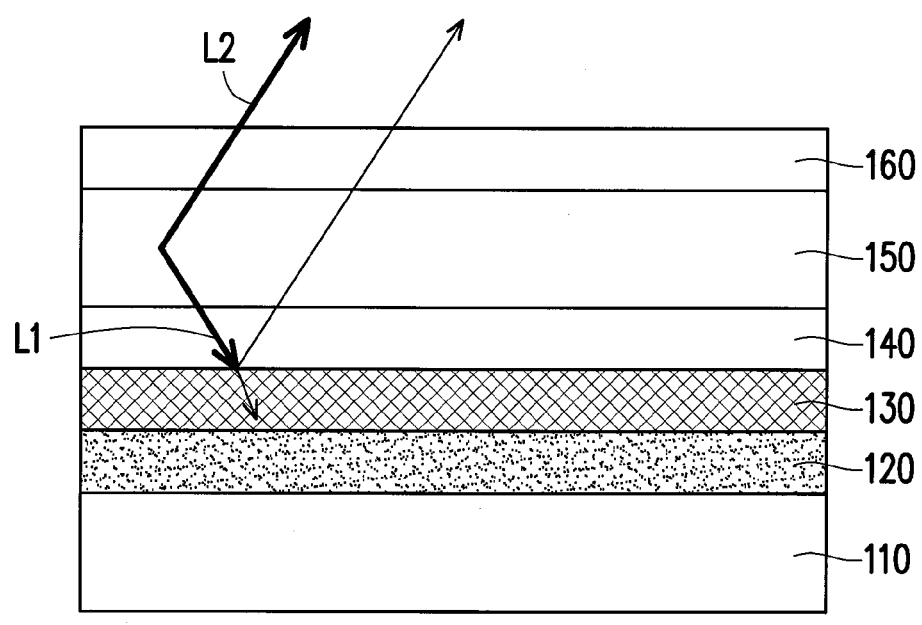
FIG. 1 is a view illustrating a display device according to an embodiment of the disclosure.

FIG. 1 is a view illustrating a display device according to an embodiment of the disclosure. As shown in FIG. 1, a display device 100 includes a substrate 110, a light absorption layer 120, an optical matching layer 130, a first transparent electrode 140, a light emitting layer 150, and a second transparent electrode 160. The light absorption layer 120 is disposed on the substrate 110, and the optical matching layer 130 is disposed on the light absorption layer 120. In addition, the first transparent electrode 140 is disposed on the optical matching layer 130, the light emitting layer 150 is disposed on the first transparent electrode 140, and the second transparent electrode 160 is disposed on the light emitting layer 150. The light absorption layer 120 is black resin, for example, for absorbing external ambient light. Alternatively, the light absorption layer 120 may include a multi-layer structure formed by alternately stacking different layers, such as a low reflectance multi-layer structure formed by alternately stacking a plurality of LiF layers and a plurality of Cr layers. The first transparent electrode 140 and the second transparent electrode 160 may be respectively an anode and a cathode that provide a current to the light emitting layer 150, so that the light emitting layer 150 may emit light beams L1 and L2. Here, the light emitting layer 150 may be any organic light emitting layer suitable for an organic light emitting diode (OLED) display device, or an inorganic light emitting layer (or a quantum dot light emitting layer) suitable for a quantum dot light emitting diode (QLED) display device, for example.

In this embodiment, to prevent the light beam L1 emitted downward from being absorbed by the light absorption layer 120, the light matching layer 130 is disposed between the light absorption layer 120 and the first transparent electrode 140. In addition, with the optical matching layer 130 being matched with the light absorption layer 120, a portion of the light beam L1 emitted downward may be reflected by the optical matching layer 130 to maintain a top output luminance without reflecting a significant amount of the ambient light. Here, a refractive index of the light absorption layer 120 and a refractive index of the light matching layer 130 are set to satisfy the following condition: $0.008 < [(n1-n2)/(n1+n2)]^2 < 0.8$, wherein n1 is the refractive index of the light absorption layer, and n2 is a refractive index of the optical matching layer. In this embodiment, the refractive index of the light absorption layer 120 is smaller than the refractive index of the optical matching layer 130. Namely, in this embodiment, the top output luminance and a reflectance of the ambient light are controlled by adjusting the refractive indices of the optical matching layer 130 and the light absorption layer 120, so as to increase an ambient contrast ratio of the display device 100. The optical matching layer 130 may include a multi-layer structure formed by alternately stacking different films, such as a multi-layer structure formed by alternately stacking a plurality of $SiO_2$ and $TiO_2$ layers.

More specifically, when the optical matching layer 130 includes a metal material, such as Al, Ag, or AlNd, etc., the refractive index of the light absorption layer 120 and the refractive index of the light matching layer 130 satisfy the following condition: $0.008 < [(n1-n2)/(n1+n2)]^2 < 0.8$. Also, when the optical matching layer 130 includes a material such as Si, the refractive index of the light absorption layer 120 and the refractive index of the light matching layer 130 satisfy the following condition: $0.008 < [(n1-n2)/(n1+n2)]^2 < 0.3$. Furthermore, when the optical matching layer 130 includes an organic material or a metal oxide, such as $SiO_x$ or $Nb_2O_x$, etc., the refractive index of the light absorption layer 120 and the refractive index of the light matching layer 130 satisfy the following condition: $0.008 < [(n1-n2)/(n1+n2)]^2 < 0.15$.

Figure 2A:
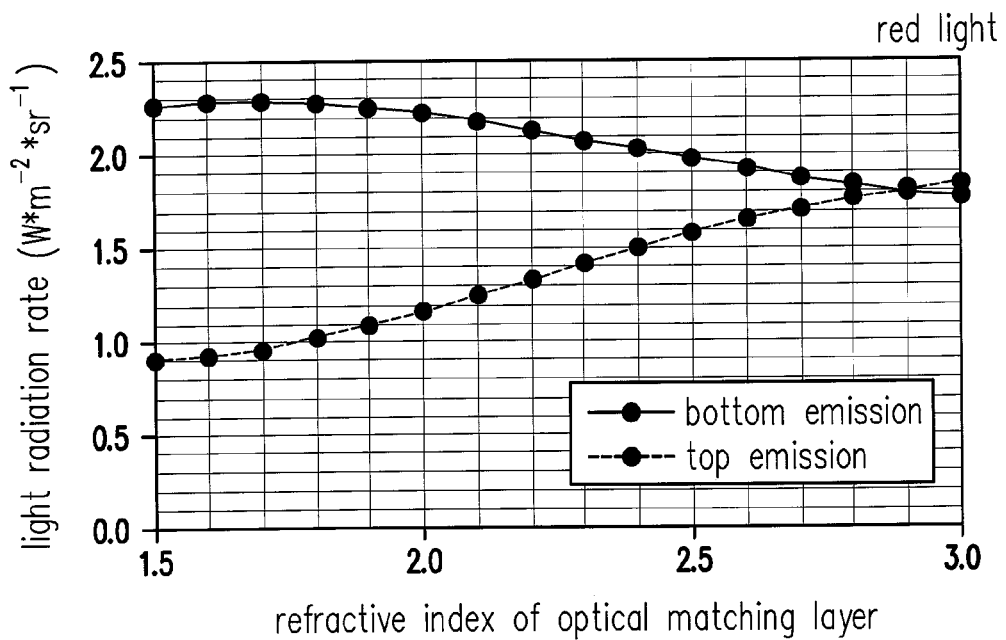
FIGS. 2A to 2C are views illustrating simulations on light emitting intensities of the display device of FIG. 1.
Figure 2B:
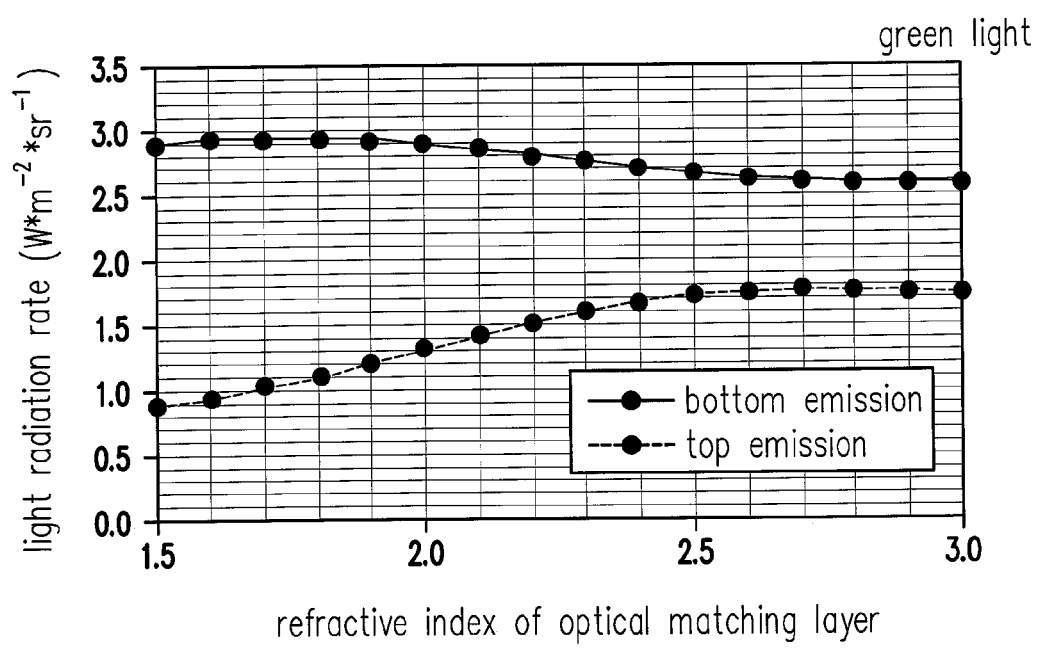
Figure 2C:
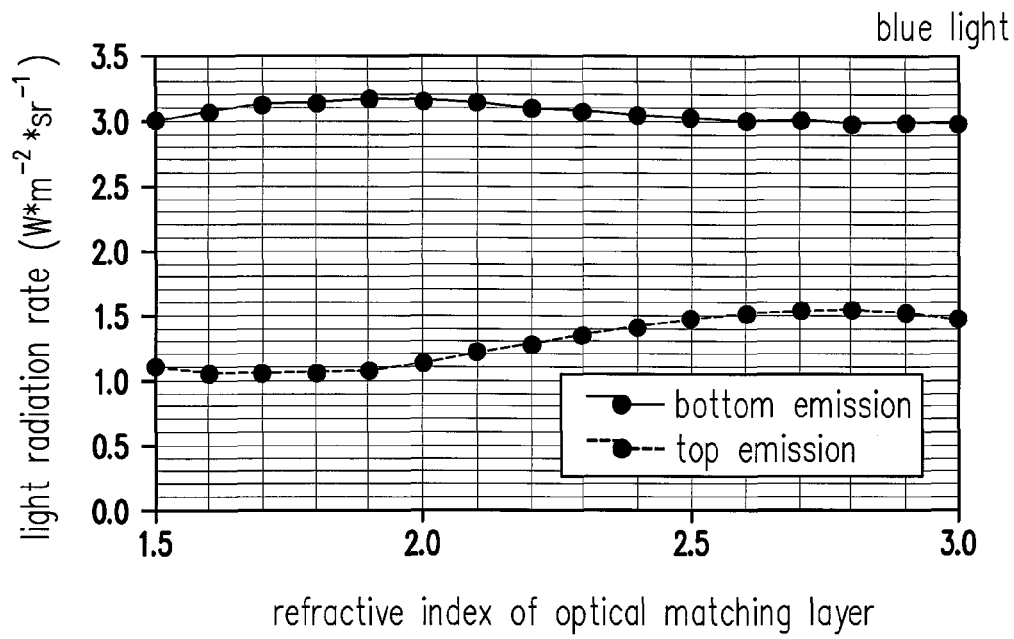

FIGS. 2A to 2C are views illustrating simulations on light emitting intensities of the display device 100. FIG. 2A illustrates top and bottom light emitting intensities of red light with a wavelength of 650 nm, FIG. 2B illustrates top and bottom light emitting intensities of green light with a wavelength of 550 nm, and FIG. 2C illustrates top and bottom light emitting intensities of blue light with a wavelength of 450 nm. As shown in FIGS. 2A to 2C, when the refractive index of the optical matching layer 130 is higher, a light radiation rate of bottom emission is lower, and a higher light radiation rate of top emission indicates a higher top output luminance. In particular, when the refractive index of the optical matching layer 130 is higher than or equal to 1.8, the tendency becomes more obvious. Accordingly, the refractive index of the optical matching layer 130 may be set to be higher than or equal to 1.8.

Besides, Table 1 shows a simulation of light emission of the display device where a thickness of the optical matching layer is set to be 70 nanometers, and the refractive index thereof is set to be 2.4. Assuming other conditions are equal, results of the simulation are provided in Table 1.

TABLE 1

| | Luminance (nits) | Reflectance to light with a wavelength of 550 nm |
|---|---|---|
| Display device having optical matching layer and light absorption layer | 902 | 7.9% |
| Display device having light absorption layer | 498 | 1.8% |

Figure 3:
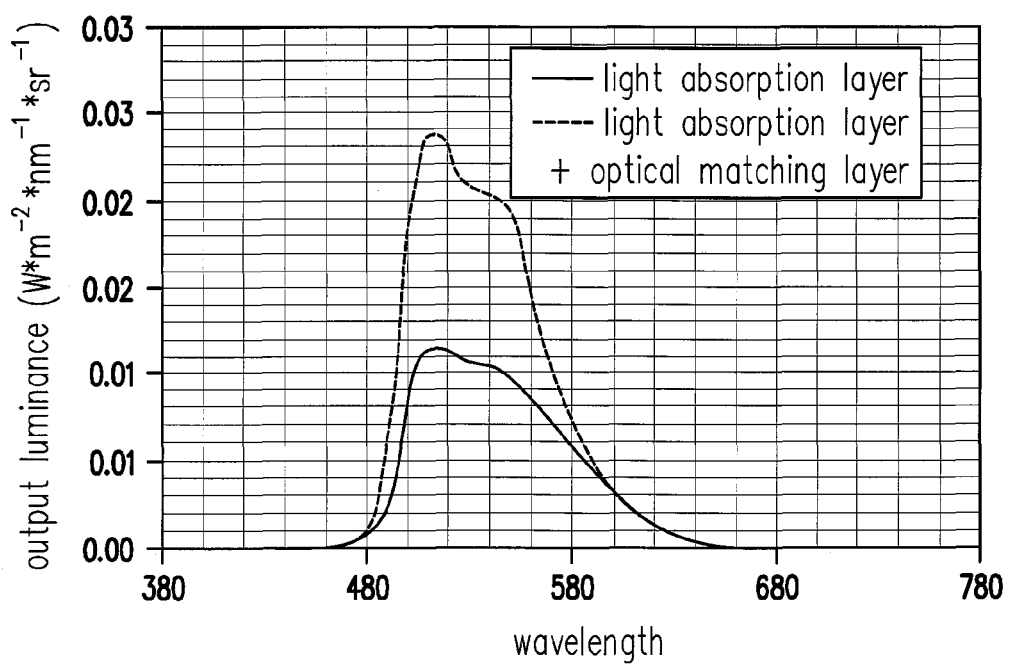
FIG. 3 is a view illustrating a relation between wavelengths and light emitting densities of display devices according to two embodiments of the disclosure.

As shown in Table 1, a green light display device having the optical matching layer has a higher output luminance than that of a green light display device without the optical matching layer. Moreover, FIG. 3 further illustrates a relation between the wavelengths and light emitting densities of the green light display devices. As shown in FIG. 3, the display device having the optical matching layer has a significantly higher light emitting intensity within a specific wavelength range (e.g., 500 nm to 600 nm).

Certainly, in practices, the refractive index or thickness of the optical matching layer 130 of this embodiment may be adjusted according to the ambient light or a wavelength of light emitted by the light emitting layer 150. In other words, when displaying, the refractive index or thickness of the optical matching layer 130 may be adjusted to compensate and find a balance between colored light emitted by different color pixels and the ambient light.

Figure 4:
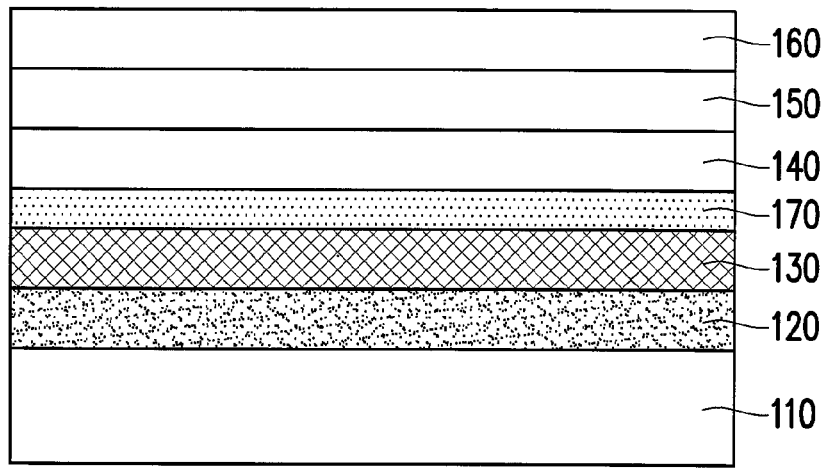
FIG. 4 is a view illustrating a display device according to another embodiment of the disclosure.

FIG. 4 is a view illustrating a display device according to another embodiment of the disclosure. As shown in FIG. 4, a display device 400 of this embodiment is similar to the display device 100 of the previous embodiment, except for a main difference that a transflective layer 170 is disposed between the optical matching layer 130 and the first transparent electrode 140 in this embodiment.

A material of the transflective layer 170 may be metal, such as Ag. When the ambient light and the light emitted by the light emitting layer 150 reach the transflective layer 170, a portion of the light may pass through the transflective layer 170, and another portion of the light may be reflected. Thus, in this embodiment, a top output luminance of the display device 400 may be controlled by adjusting a thickness and a transmittance of the transflective layer 170 and the refractive index and the thickness of the optical matching layer 130. Specifically, the thickness of the transflective layer 170 of this embodiment may be in a range from 1 nm to 12 nm, the transmittance of the transflective layer 170 may be in a range from 40% to 80%, and the refractive index thereof may be in a range from 0.1 to 0.4, for example.

In the following, several embodiments (FIGS. 5 to 7) of the display device are provided. It should be noted that in the embodiments of FIGS. 5 to 7, like or similar elements are represented by like or similar symbols. Also, only the differences between the embodiments and the previous embodiments are described without repeating like or similar features and effects mentioned in the previous embodiments.

Figure 5:
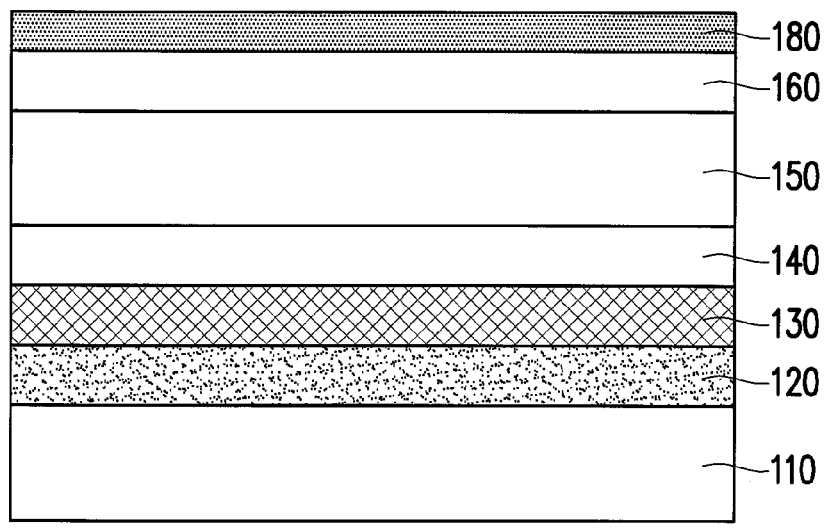
FIG. 5 is a view illustrating a display device according to another embodiment of the disclosure.

FIG. 5 is a view illustrating a display device according to another embodiment of the disclosure. As shown in FIG. 5, a display device 500 of this embodiment is similar to the display device 100 of the previous embodiment, except for a main difference that an anti-reflection layer 180 is additionally disposed on a second transparent electrode 160 in this embodiment. Like or similar features and effects mentioned in the previous embodiments are not repeated in this embodiment. The anti-reflection layer 180 is a multi-layer structure, for example. In addition, two or more dielectric materials or metal materials having different refractive indices may be used. Also, thicknesses of the respective layers may be adjusted based on needs, so as to cause destructive interference to the ambient light. Accordingly, the reflection of the ambient light may be reduced to increase the ambient contrast ratio.

Figure 6:
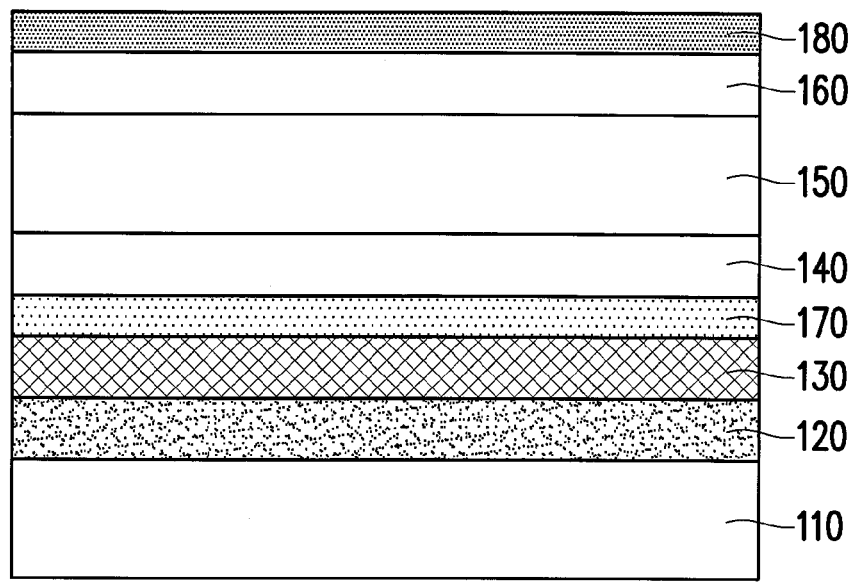
FIG. 6 is a view illustrating a display device according to another embodiment of the disclosure.

FIG. 6 is a view illustrating a display device according to another embodiment of the disclosure. As shown in FIG. 6, a display device 600 of this embodiment is similar to the display device 400 of the previous embodiment, except for a main difference that an anti-reflection layer 180 is additionally disposed on a second transparent electrode 160 in this embodiment. Like or similar features and effects mentioned in the previous embodiments are not repeated in this embodiment. The anti-reflection layer 180 is a multi-layer structure, for example. In addition, two or more dielectric materials or metal materials having different refractive indices may be used. Also, thicknesses of the respective layers may be adjusted based on needs, so as to cause destructive interference to the ambient light. Accordingly, the reflection of the ambient light may be reduced to increase the ambient contrast ratio.

Figure 7:
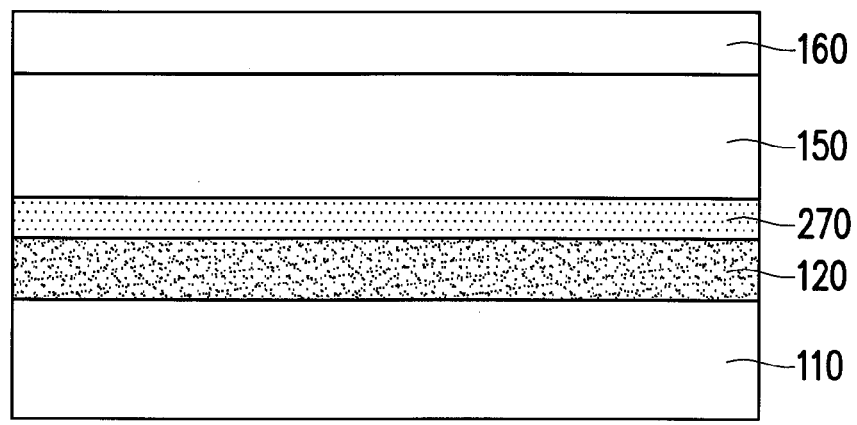
FIG. 7 is a view illustrating a display device according to an embodiment of the disclosure.

FIG. 7 is a view illustrating a display device according to an embodiment of the disclosure. As shown in FIG. 7, a display device 700 includes a substrate 110, a light absorption layer 120, a transflective electrode 270, a light emitting layer 150, and a second transparent electrode 160. The light absorption layer 120 is disposed on the substrate 110. The transflective electrode 270 is disposed on the light absorption layer 120, the light emitting layer 150 is disposed on the transflective electrode 270, and the second transparent electrode 160 is disposed on the light emitting layer 150. The light absorption layer 120 is black resin, for example, for absorbing external ambient light. Alternatively, the light absorption layer 120 may include a multi-layer structure formed by alternately stacking different layers, such as a low reflectance multi-layer structure formed by alternately stacking a plurality of LiF layers and a plurality of Cr layers.

In this embodiment, the transflective electrode 270 replaces the first transparent electrode 140 disposed at a lower position in the previous embodiment. Also, the transflective electrode 270 and the second transparent electrode 160 respectively serve as an anode and a cathode, so as to provide a current to the light emitting layer 150 to emit a light beam. Here, the light emitting layer 150 may be any organic light emitting layer suitable for an organic light emitting diode (OLED) display device, or an inorganic light emitting layer (or a quantum dot light emitting layer) suitable for a quantum dot light emitting diode (QLED) display device, for example.

A material of the transflective electrode 270 may be metal, such as Ag. When the ambient light and the light emitted by the light emitting layer 150 reach the transflective electrode 270, a portion of the light may pass through the transflective electrode 270, and another portion of the light may be reflected. Thus, in this embodiment, a top output luminance of the display device 700 may be controlled by adjusting a thickness and a transmittance of the transflective electrode 270.

Figure 8A:
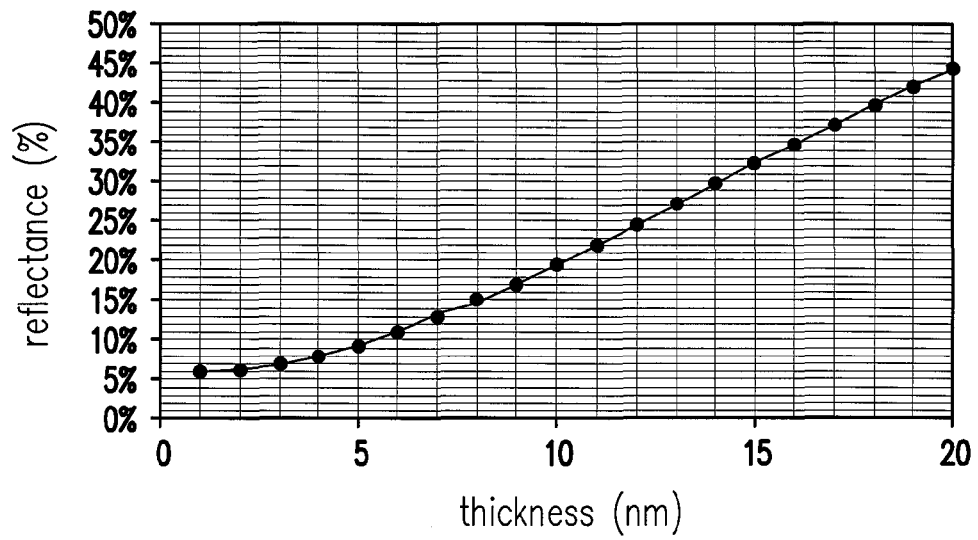
FIGS. 8A and 8B are views illustrating optical simulations on the display device of FIG. 7.
Figure 8B:
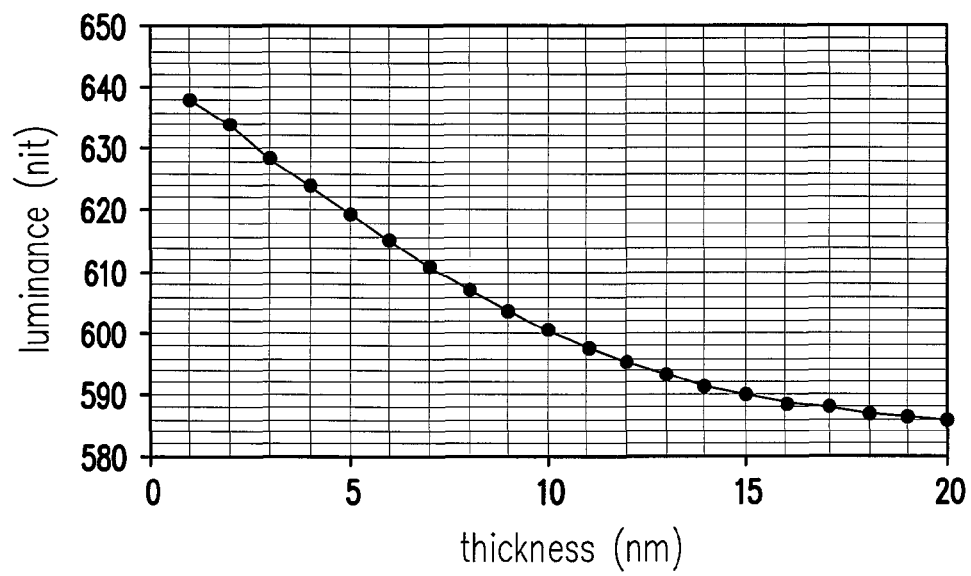

FIGS. 8A and 8B are views illustrating results of optical simulations on the display device 700. Specifically, FIG. 8A is a view illustrating a relation between the thickness of the transflective electrode 270 and the reflectance of the ambient light, and FIG. 8B is a view illustrating a relation between the thickness of the transflective electrode 270 and a device luminance. As shown in FIG. 8A, a reflectance of the ambient light of the whole device may increase as the thickness of the transflective electrode 270 increases. When the thickness is 12 nanometers, the reflectance of the ambient light is 25%, and the value of 25% is approximately an upper limit acceptable in practice. Thus, in this embodiment, the thickness of the transflective electrode 270 may be set in a range from 1 nanometer to 12 nanometers. In addition, by substituting the thickness of the transflective electrode 8B from 1 nm to 12 nm set in FIG. 8A into FIG. 8B, the obtained output luminance is higher than an output luminance of 520 nits obtained when the conventional transparent electrode (e.g., indium tin oxide electrode) is used. With the thickness of the transflective electrode 270 ranging from 1 nm to 12 nm, the corresponding transmittance of the transflective electrode 270 may be in a range from 40% to 80%, and the refractive index of the transflective electrode 270 may be in a range from 0.1 to 1.4.

Figure 9:
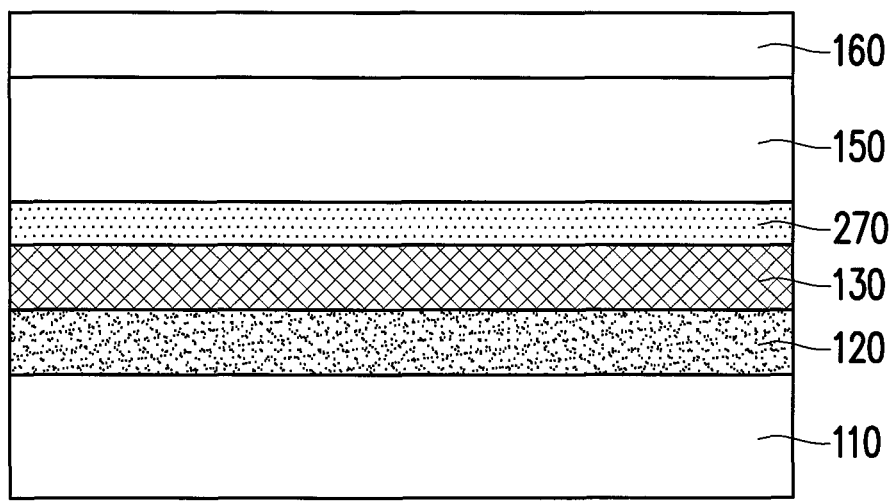
FIG. 9 is a view illustrating a display device according to another embodiment of the disclosure.

FIG. 9 is a view illustrating a display device according to another embodiment of the disclosure. As shown in FIG. 9, a display device 900 of this embodiment is similar to the display device 700 of the previous embodiment, except for a main difference that the optical matching layer 130 is disposed between the transflective electrode 270 and the light absorption layer 120. Like or similar features and effects mentioned in the previous embodiments are not repeated in this embodiment. In the following, only the difference between the embodiments is described.

As set forth in the previous embodiment, with the optical matching layer 130 being matched with the light absorption layer 120, a portion of the light beam emitted downward may be reflected by the optical matching layer 130 to maintain a top output luminance without reflecting a significant amount of the ambient light. Moreover, in this embodiment, an output luminance of the display device 900 may be controlled by adjusting the thickness and the transmittance of the transflective electrode 270 and the refractive index and the thickness of the optical matching layer 130.

Figure 10:
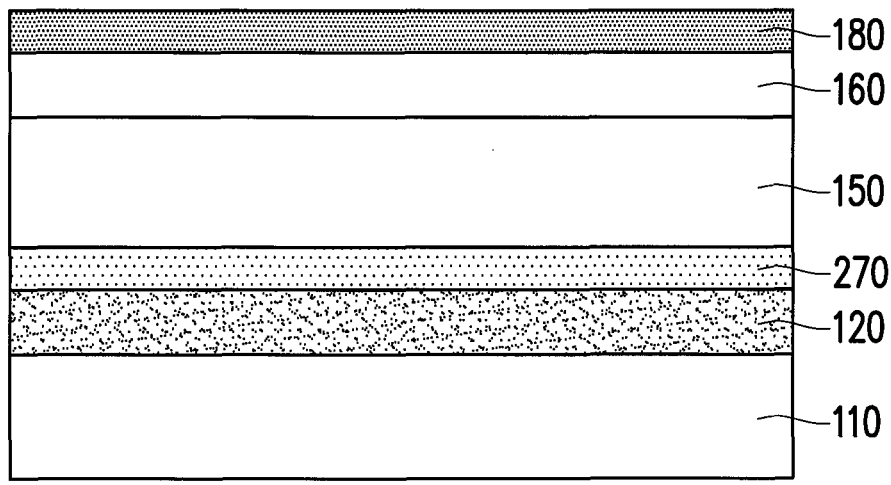
FIG. 10 is a view illustrating a display device according to another embodiment of the disclosure.

FIG. 10 is a view illustrating a display device according to another embodiment of the disclosure. As shown in FIG. 10, a display device 1000 of this embodiment is similar to the display device 700 of the previous embodiment, except for a main difference that the anti-reflection layer 180 is disposed on the transparent electrode 160 in this embodiment. Like or similar features and effects mentioned in the previous embodiments are not repeated in this embodiment. The anti-reflection layer 180 is a multi-layer structure, for example. In addition, two or more dielectric materials or metal materials having different refractive indices may be used. Also, thicknesses of the respective layers may be adjusted based on needs, so as to cause destructive interference to the ambient light. Accordingly, the reflection of the ambient light may be reduced to increase the ambient contrast ratio.

Figure 11:
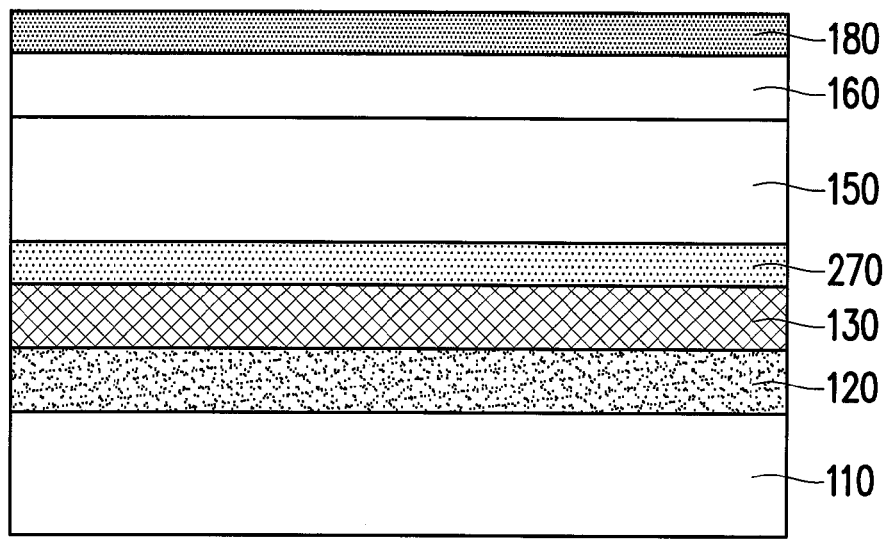
FIG. 11 is a view illustrating a display device according to another embodiment of the disclosure.

FIG. 11 is a view illustrating a display device according to another embodiment of the disclosure. As shown in FIG. 11, a display device 1100 of this embodiment is similar to the display device 900 of the previous embodiment, except for a main difference that the anti-reflection layer 180 is disposed on the transparent electrode 160 in this embodiment. Like or similar features and effects mentioned in the previous embodiments are not repeated in this embodiment. The anti-reflection layer 180 is a multi-layer structure, for example. In addition, two or more dielectric materials or metal materials having different refractive indices may be used. Also, thicknesses of the respective layers may be adjusted based on needs, so as to cause destructive interference to the ambient light. Accordingly, the reflection of the ambient light may be reduced to increase the ambient contrast ratio.

Figure 12:
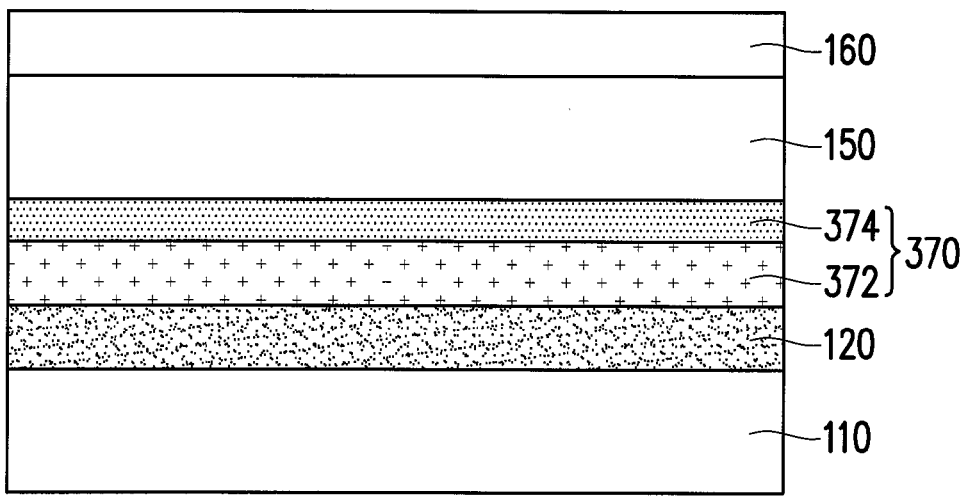
FIG. 12 is a view illustrating a display device according to another embodiment of the disclosure.

FIG. 12 is a view illustrating a display device according to another embodiment of the disclosure. As shown in FIG. 12, a display device 1200 of this embodiment is similar to the display device 700 of the previous embodiment, except for a main difference that, in addition to a transflective metal layer 372, a transflective electrode 370 of this embodiment further includes a transparent conductive layer 374 disposed on the transflective metal layer 372. As set forth in the previous embodiment, a top output luminance of the display device 1200 may be controlled by adjusting a thickness and a transmittance of the transflective metal layer 372 in this embodiment.

Figure 13:
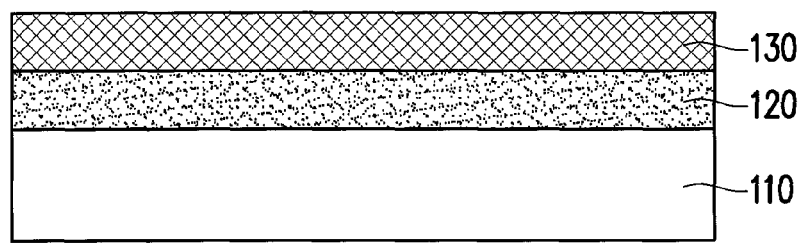
FIG. 13 is a view illustrating an optical film according to an embodiment of the disclosure.

Based on the embodiments, the disclosure further provides an optical film capable of increasing the output luminance and the ambient contrast ratio under a circumstance that the ambient light reflection is controlled, and the optical film may be combined with a display device. The optical film is suitable for a self-illuminating display device such as an OLED device or a QLED device, so as to control a light beam emitted by the display device and the ambient light. In other words, a design concept of the optical film of the disclosure is to separate parts in the previous embodiments other than the conventional light emitting display element as an optical film. Accordingly, when the optical film is independently manufactured, the optical film may be disposed on various display devices to accomplish technical effects described in the embodiments. Similarly, like or similar elements of the previous embodiments are described with like or similar symbols, and details in these respects will not be repeated in the following. FIG. 13 is a view illustrating an optical film according to an embodiment of the disclosure. As shown in FIG. 13, an optical film 1300 includes a substrate 110 and an optical matching layer 130. The light absorption layer 120 is disposed on the substrate 110 in this embodiment. In addition, the optical matching layer 130 is disposed on the light absorption layer 120. In addition, the refractive index of the light absorption layer 120 and the refractive index of the optical matching layer 130 satisfy $0.008<[(n1-n2)/(n1+n2)]^2<0.8$, wherein n1 is the refractive index of the light absorption layer 120, and n2 is the refractive index of the optical matching layer 130. The refractive index of the light absorption layer 120 may be smaller than the refractive index of the optical matching layer 130. Also, the refractive index of the optical matching layer 130 may be in a range from 1.8 to 2.8. The light absorption layer 120 may include a multi-layer structure formed by alternately stacking different layers, such as a low reflectance multi-layer structure formed by alternately stacking a plurality of LiF layers and a plurality of Cr layers. However, the light absorption layer 120 is not limited thereto.

Even though the light absorption layer 120 is additionally manufactured on the substrate 110, a single substrate having a light absorbing property may be directly used in other embodiments not shown herein to replace a dual-layer structure formed by the light absorption layer 120 and the substrate 110 of this embodiment.

Figure 14:
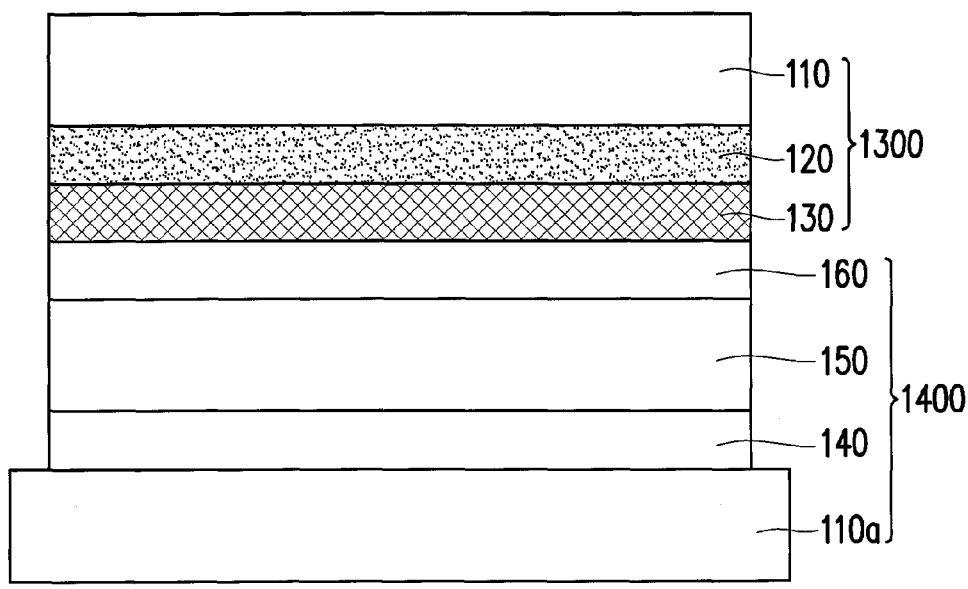
FIG. 14 is a schematic view illustrating applying the optical film of FIG. 13 in a display device.

FIG. 14 is a schematic view illustrating applying the optical film of FIG. 13 in a display device. As shown in FIG. 14, the optical matching layer 130 of an optical film 1300 faces a display device 1400 and is attached to a side of the display device 1400. The display device 1400, for example, is a light emitting diode display device manufactured on a substrate 110a and having a first transparent electrode 140, a light emitting layer 150, and a second transparent electrode 160. In addition, the display device 1400 outputs a light beam toward the bottom of the drawing.

Since the optical film 1300 is disposed on a back side with respect to a light emitting direction of the display device 1400 of this embodiment, the ambient light may be absorbed with the optical matching layer 130 being matched with the light absorption layer 120 in the optical film 1300, so as to avoid reflection of a significant amount of the ambient light. Also, a portion of the light beam from the light emitting layer 150 is reflected by the optical matching layer 130 to maintain a bottom output luminance.

Figure 15:
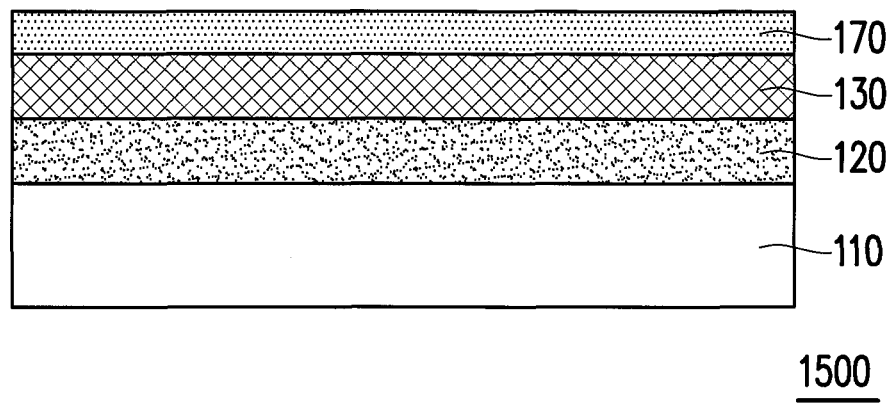
FIG. 15 is a view illustrating an optical film according to another embodiment of the disclosure.

FIG. 15 is a view illustrating an optical film according to another embodiment of the disclosure. As shown in FIG. 15, an optical film 1500 of this embodiment is similar to the optical film 1300 of the previous embodiment, except for a main difference that the transflective layer 170 is disposed on a surface of the optical matching layer 130 in this embodiment. Like or similar features and effects mentioned in the previous embodiments are not repeated in this embodiment. In the following, only the difference between the embodiments is described.

A material of the transflective layer 170 may be metal, such as Ag. If the optical film 1500 is combined with the display device, a portion of the ambient light and the light beam emitted by the display device may pass through the transflective layer 170, and another portion may be reflected when the ambient light and the light beam emitted by the display device reach the transflective layer 170. Thus, in this embodiment, an output luminance of the display device may be controlled by adjusting the thickness and the transmittance of the transflective layer 170 and the refractive index of the optical matching layer 130. Specifically, the thickness of the transflective layer 170 of this embodiment may be in a range from 1 nm to 12 nm, and the transmittance of the transflective layer 170 may be in a range from 40% to 80%, for example.

Figure 16:
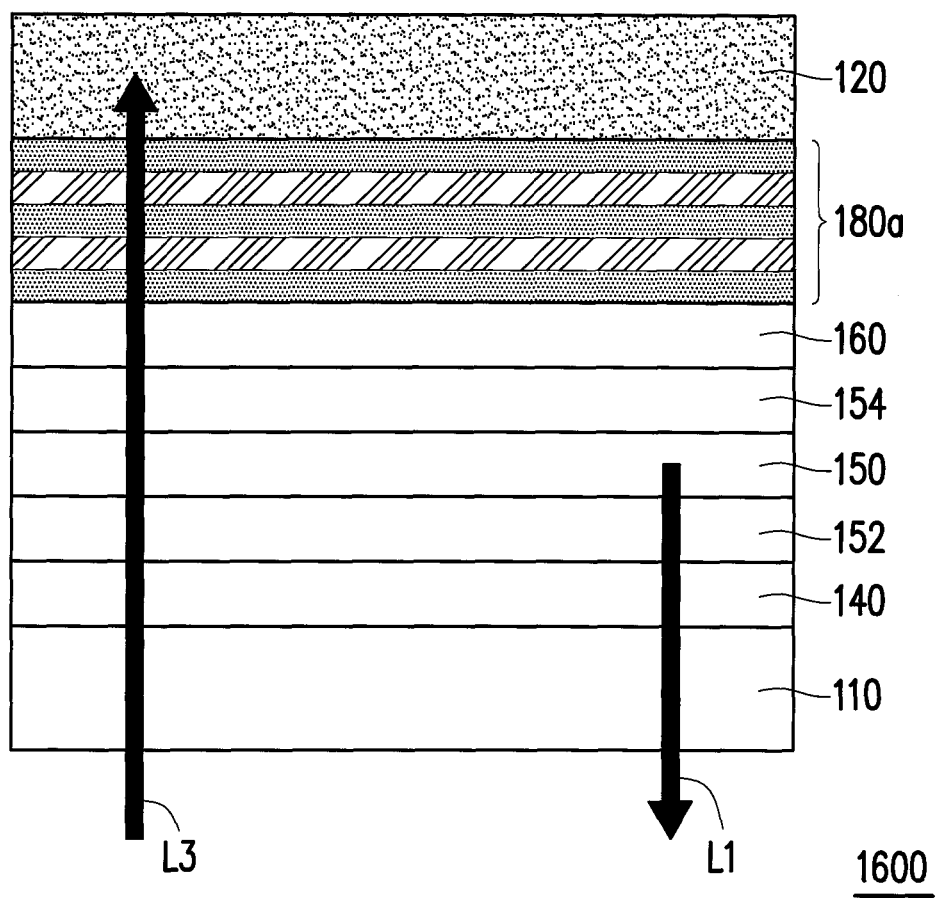
FIG. 16 is a view illustrating a display device according to another embodiment of the disclosure.

FIG. 16 is a view illustrating a display device according to another embodiment of the disclosure. As shown in FIG. 16, a display device 1600 includes a substrate 110, a first transparent electrode 140, a light emitting layer 150, a second transparent electrode 160, an anti-reflection layer 180a, and a light absorption layer 120. The first transparent electrode 140 is disposed on the substrate 110, the light emitting layer 150 is disposed on the first transparent electrode 140, and the second transparent electrode 160 is disposed on the light emitting layer 150. Moreover, the anti-reflection layer 180a is disposed on the second transparent electrode 160, and the light absorption layer 120 is disposed on the anti-reflection layer 180a.

The substrate 110 may be formed of glass or plastics, and may be flexible or rigid. Also, the reflectance of the substrate 110 is in a range from 1.4 to 2.2. The first transparent electrode 140 and the second transparent electrode 160 may be respectively an anode and a cathode that provide a current to the light emitting layer 150, so that the light emitting layer 150 may emit a light beam. Materials of the first transparent electrode 140 and the second transparent electrode 160 may include a transparent conductive oxide, such as indium tin oxide (ITO), indium zinc oxide (IZO), or a semi-transparent metal thin film.

In this embodiment, a structure formed by several different material layers is provided between the first transparent electrode 140 and the second transparent electrode 160. More specifically, the display device 1600 further includes a first organic layer 152 and a second organic layer 154. The first organic layer 152 is disposed on the first transparent electrode 140, the light emitting layer 150 is disposed on the first organic layer 152, the second organic layer 154 is disposed on the light emitting layer 150, and the second transparent electrode 160 is disposed on the second organic layer 154. The first organic layer 152 and the second organic layer 154 may respectively serve as a hole injection layer, a hole transport layer, a hole blocking layer, or an electron transport layer. Here, the light emitting layer 150 may be any organic light emitting layer suitable for an organic light emitting diode (OLED) display device, or an inorganic light emitting layer (or a quantum dot light emitting layer) suitable for a quantum dot light emitting diode (QLED) display device, for example.

The anti-reflection layer 180a is a multi-layer structure, for example. In addition, two or more dielectric materials or metal materials having different refractive indices may be used. Also, thicknesses of the respective layers may be adjusted based on needs, so as to cause destructive interference to the ambient light. Accordingly, the reflection of the ambient light may be reduced to increase the ambient contrast ratio. The light absorption layer 120 is black resin, for example, for absorbing external ambient light. Alternatively, the light absorption layer 120 may include a multi-layer structure formed by alternately stacking different layers, such as a low reflectance multi-layer structure formed by alternately stacking a plurality of LiF layers and a plurality of Cr layers.

The light beam L1 emitted from the light emitting layer 150 is transmitted toward the bottom of the drawing. Ambient light L3 passing the respective layers may be absorbed by the light absorption layer 120 with assistance of the anti-reflection layer 180a. When thicknesses of the layers of the anti-reflection layer 180a are optimized, a reflection coefficient of the anti-reflection layer 180a is sufficiently low to substitute for the anti-reflection effect of a circular polarizer. The anti-reflection layer 180a may help reduce an effective refractive index. With the assistance of a substrate with a high refractive index, the efficiencies of direct emission and substrate mode are improved.

Figure 17:
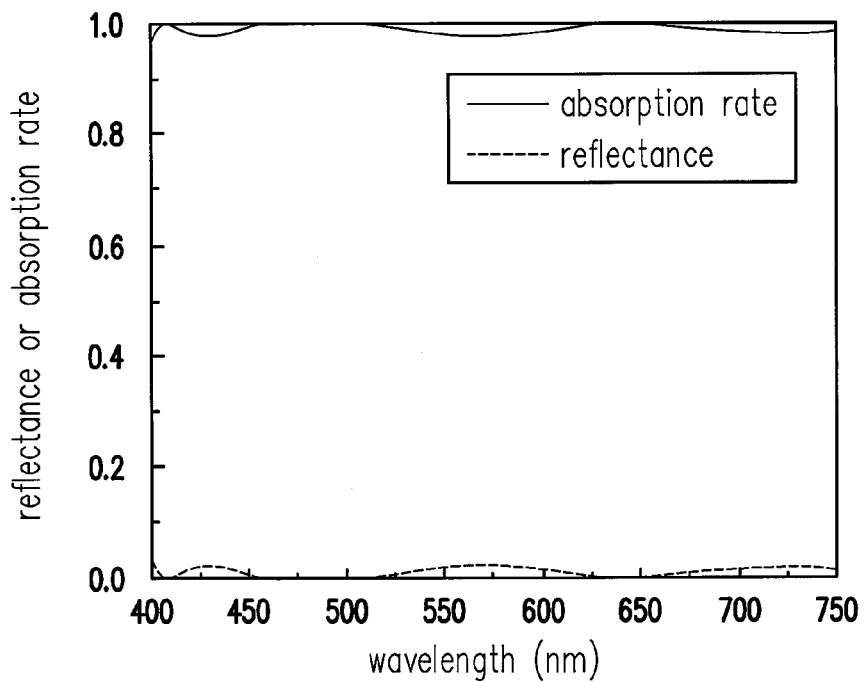
FIG. 17 is a view illustrating a relation between a wavelength and a reflectance/absorption rate of the display device of FIG. 16 exemplified as an organic light emitting diode (OLED).

FIG. 17 is a view illustrating a relation between a wavelength and a reflectance/absorption rate of the display device of FIG. 16 exemplified as an organic light emitting diode (OLED). As shown in the results of Table 2 and FIG. 17, the structure of this embodiment provides a relatively low reflectance. Here, a luminous reflectance is defined as $$R_L = \frac{\int_{\lambda_1}^{\lambda_2} V(\lambda) R(\lambda) S(\lambda) d\lambda}{\int_{\lambda_1}^{\lambda_2} V(\lambda) S(\lambda) d\lambda},$$

wherein $V(\lambda)$ is a spectral eye sensitivity, $R(\lambda)$ is a reflectance of the display device, and $S(A)$ is a spectrum of the ambient light. The reflectance is 1.12%. The value is relatively low and allows the anti-reflection layer 180a to substitute for the anti-reflection effect of a circular polarizer.

Figure 18:
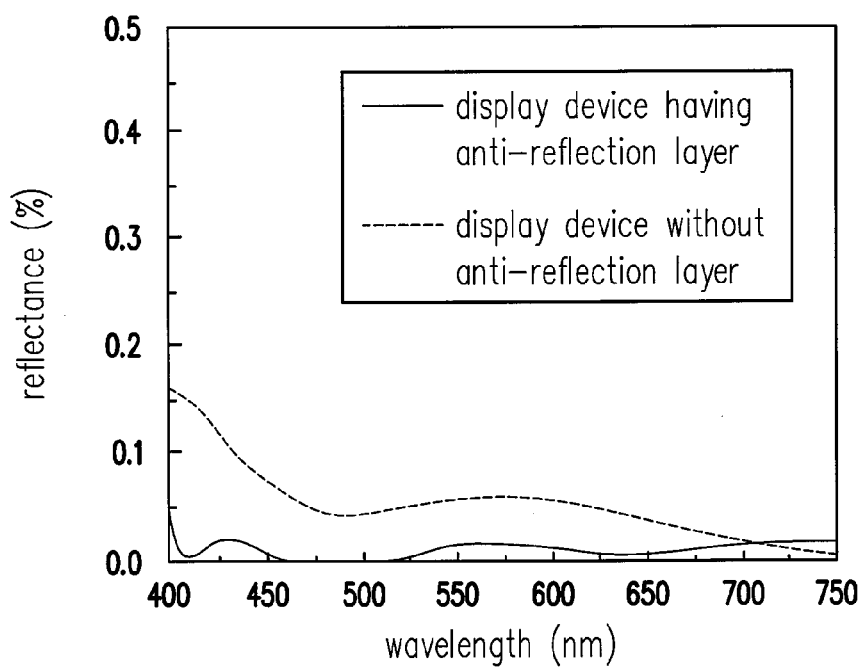
FIG. 18 is a view illustrating a relation between a wavelength and a reflectance and comparing the display device (exemplified as an OLED display device having an anti-reflection layer) of FIG. 16 and a display device without an anti-reflection layer.

Moreover, FIG. 18 is a view illustrating a relation between a wavelength and a reflectance and comparing the display device (exemplified as an OLED display device having an anti-reflection layer) of FIG. 16 and a display device without an anti-reflection layer. Structures and thicknesses of the respective layers in the anti-reflection layer 180a of the display device 1600 where an OLED is used as the light emitting layer 150 are provided in Table 2. As shown in FIG. 18 and Table 2, the anti-reflection layer 180a may result in further reducing the reflectance and increasing the efficiency.

TABLE 2

| Structure | Display device of FIG. 16 | | Display device without anti-reflection layer | |
|---|---|---|---|---|
| | Material | Thickness | Material | Thickness |
| | $SiO_2$ | 19 nm | $SiO_2$ | — |
| | $TiO_2$ | 31 nm | $TiO_2$ | — |
| | $SiO_2$ | 36 nm | $SiO_2$ | — |
| | $TiO_2$ | 18 nm | $TiO_2$ | — |
| | $SiO_2$ | 208 nm | $SiO_2$ | — |
| | $TiO_2$ | 17 nm | $TiO_2$ | — |
| Efficiency | Direct Emission | 9.9% | Direct Emission | 10.2% |
| | Substrate mode | 49.1% | Substrate mode | 40.0% |
| Luminous reflectance | 1.12% | | 5.50% | |

Figure 19:
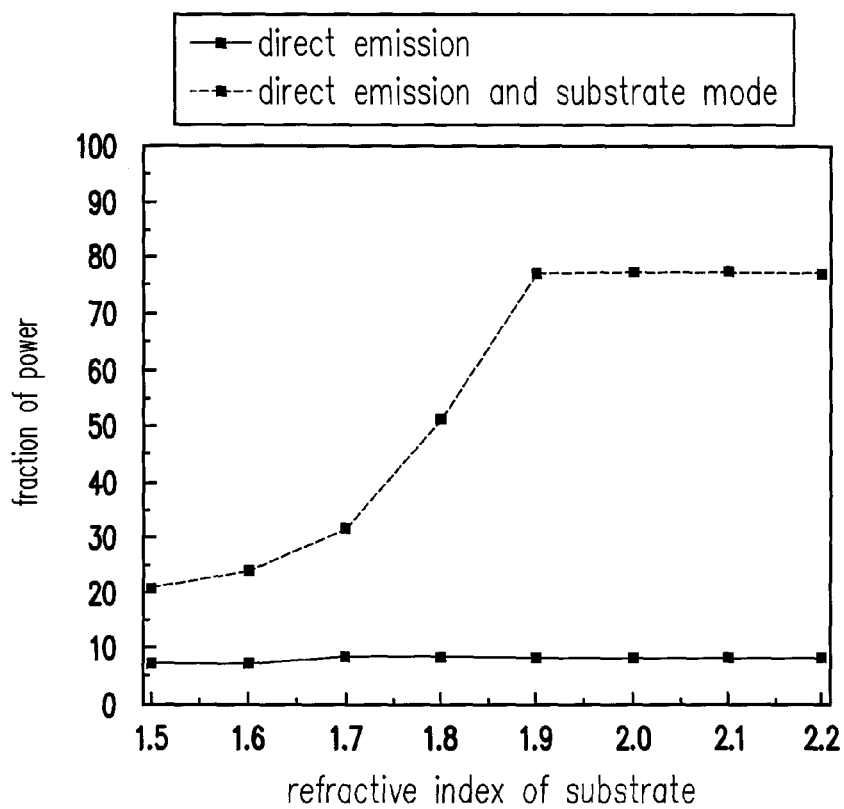
FIG. 19 is a view illustrating a relation between a substrate reflectance and a fraction of power of the display device of FIG. 16 exemplified as an OLED display device.

Moreover, FIG. 19 is a view illustrating a relation between a substrate reflectance and a fraction of power of the display device of FIG. 16 exemplified as an OLED display device. FIG. 19 illustrates the efficiencies of direction emission and substrate mode of the display device shown in FIG. 16. As shown in FIG. 19, when the refractive index of the substrate increases, the efficiency of substrate mode significantly increases. When the substrate refractive index exceeds 1.80, the efficiencies of direct emission and substrate mode may exceed 60%.

Figure 20:
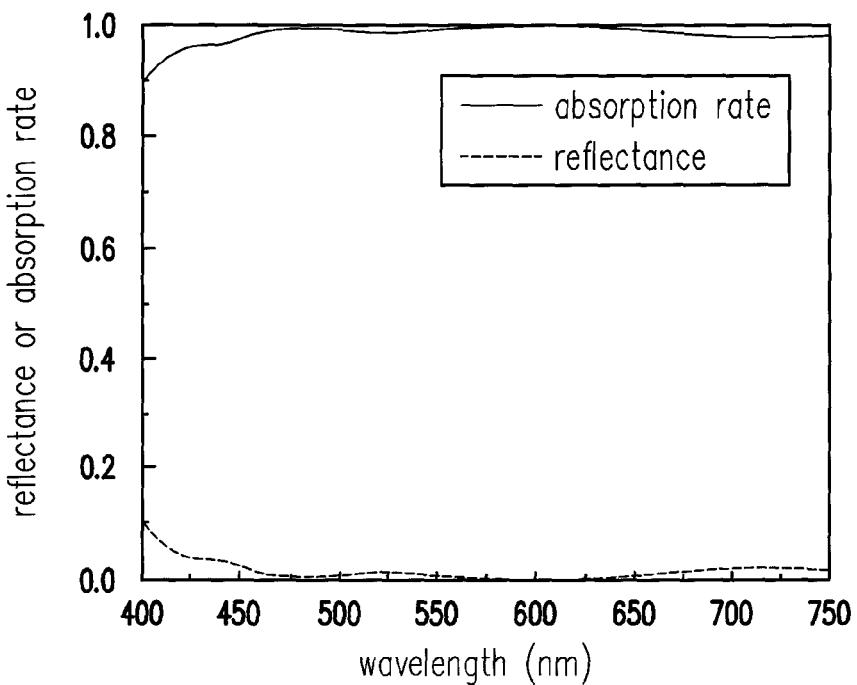
FIG. 20 is a view illustrating a relation between a wavelength and a reflectance/absorption rate of the display device of FIG. 16 exemplified as a quantum dot light emitting diode (QLED).

If an inorganic light emitting layer (or a quantum dot light emitting layer) suitable for a quantum dot light emitting diode display device (QLED) is used as the light emitting layer 150 of the display device shown in FIG. 16, for example, structures and thicknesses of the respective layers in the anti-reflection layer 180a of the display device 1600 where an inorganic light emitting layer (or a quantum dot light emitting layer) suitable for a quantum dot light emitting diode display device (QLED) is used as the light emitting layer 150 are provided in Table 3. FIG. 20 is a view illustrating a relation between a wavelength and a reflectance/absorption rate of the display device of FIG. 16 exemplified as a quantum dot light emitting diode (QLED). As shown in Table 3 and FIG. 20, in the whole visible spectrum, a light emitting reflectance of the display device is relatively low. The value of 0.78% is even lower than the value obtained when a circular polarizer is used.

TABLE 3

| Structure | Material | Thickness |
|---|---|---|
| | $SiO_2$ | 34 nm |
| | $TiO_2$ | 10 nm |
| | $SiO_2$ | 85 nm |
| | $TiO_2$ | 3 nm |
| | $SiO_2$ | 245 nm |
| | $TiO_2$ | 20 nm |
| Efficiency | Direct Emission | 8.5% |
| | Substrate mode | 42.9% |
| Luminous reflectance | | 0.78% |

Figure 21:
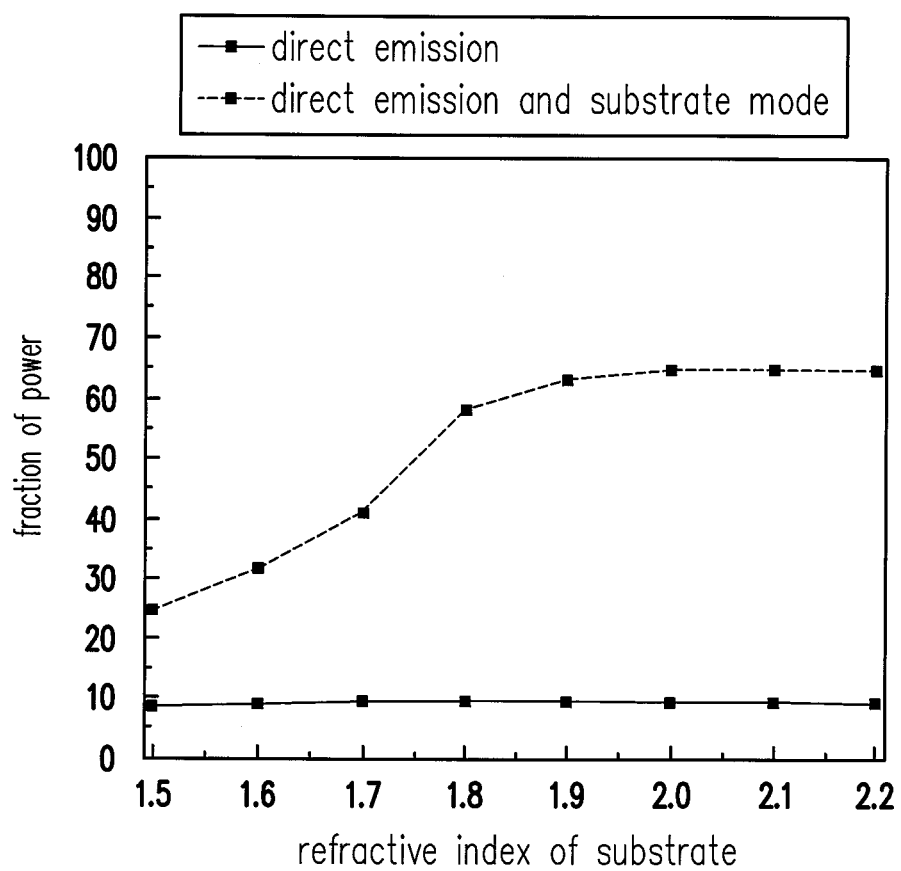
FIG. 21 is a view illustrating a relation between a substrate reflectance and a fraction of power of the display device of FIG. 16 exemplified as an QLED display device.

FIG. 21 is a view illustrating a relation between a substrate reflectance and a fraction of power of the display device of FIG. 16 exemplified as a QLED display device having an inorganic light emitting layer (or a quantum dot light emitting layer). As shown in FIG. 21, when the refractive index of the substrate increases, the efficiency of substrate mode significantly increases. When the substrate refractive index exceeds 1.90, the efficiencies of direct emission and substrate mode may exceed 80%.

Figure 22:
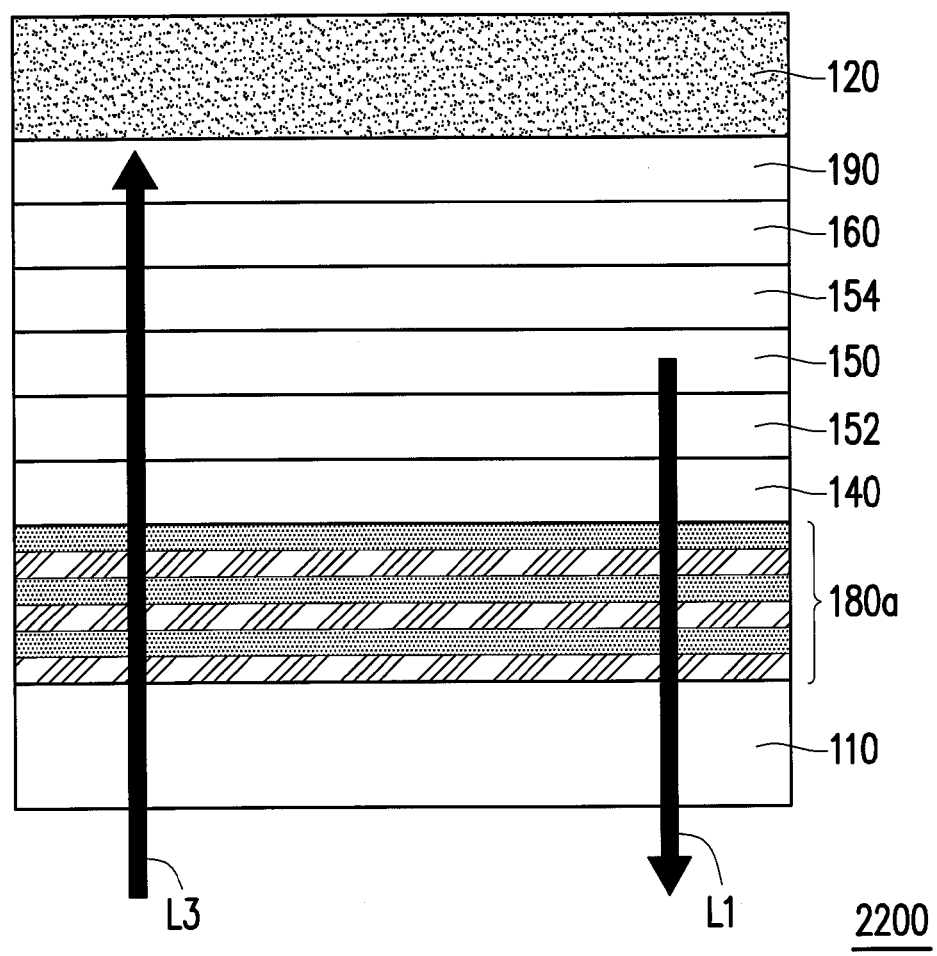
FIG. 22 is a view illustrating a display device according to another embodiment of the disclosure.

FIG. 22 is a view illustrating a display device according to another embodiment of the disclosure. As shown in FIG. 22, a display device 2200 includes a substrate 110, an anti-reflection layer 180a, a first transparent electrode 140, a first organic layer 152, a light emitting layer 150, a second organic layer 154, a second transparent electrode 160, a buffer layer 190, and a light absorption layer 120. The anti-reflection layer 180a is disposed on the substrate 110, the first transparent electrode 140 is disposed on the anti-reflection layer 180a, the first organic layer 152 is disposed on the first transparent electrode 140, the light emitting layer 150 is disposed on the first organic layer 152, the second organic layer 154 is disposed on the light emitting layer 150, the second transparent electrode 160 is disposed on the second organic layer 154, the buffer layer 190 is disposed on the second transparent electrode 160, and the light absorption layer 120 is disposed on the buffer layer 190.

The substrate 110 may be formed of glass or plastics, and may be flexible or rigid. Also, the reflectance of the substrate 110 is in a range from 1.4 to 2.2. The first transparent electrode 140 and the second transparent electrode 160 may be respectively an anode and a cathode that provide a current to the light emitting layer 150, so that the light emitting layer 150 may emit a light beam. The materials of the first transparent electrode 140 and the second transparent electrode 160 may include a transparent conductive oxide, such as indium tin oxide (ITO), indium zinc oxide (IZO), or a semi-transparent metal thin film.

The first organic layer 152 and the second organic layer 154 may respectively serve as a hole injection layer, a hole transport layer, a hole blocking layer, or an electron transport layer. Here, the light emitting layer 150 may be any organic light emitting layer suitable for an organic light emitting diode (OLED) display device, or an inorganic light emitting layer (or a quantum dot light emitting layer) suitable for a quantum dot light emitting diode (QLED) display device, for example.

The anti-reflection layer 180a is a multi-layer structure, for example. In addition, two or more dielectric materials or metal materials having different refractive indices may be used. Also, thicknesses of the respective layers may be adjusted based on needs, so as to cause destructive interference to the ambient light. Accordingly, the reflection of the ambient light may be reduced to increase the ambient contrast ratio. The light absorption layer 120 is black resin, for example, for absorbing external ambient light. Alternatively, the light absorption layer 120 may include a multi-layer structure formed by alternately stacking different layers, such as a low reflectance multi-layer structure formed by alternately stacking a plurality of LiF layers and a plurality of Cr layers. The buffer layer 190 serves to planarize a surface of the second transparent electrode 160 and separate the second transparent electrode 160 from the light absorption layer 120. In other embodiments, the buffer layer 190 may be omitted.

The light beam L1 emitted from the light emitting layer 150 is transmitted toward the bottom of the drawing. The ambient light L3 passing the respective layers may be absorbed by the light absorption layer 120 with assistance of the anti-reflection layer 180a. When the thicknesses of the layers of the anti-reflection layer 180a are optimized, the reflection coefficient of the anti-reflection layer 180a is sufficiently low to substitute for the anti-reflection effect of a circular polarizer. The anti-reflection layer 180a and the buffer layer 190 may help reduce the effective refractive index. With the assistance of a substrate with a high refractive index, the efficiencies of direct emission and substrate mode are improved.

Figure 23:
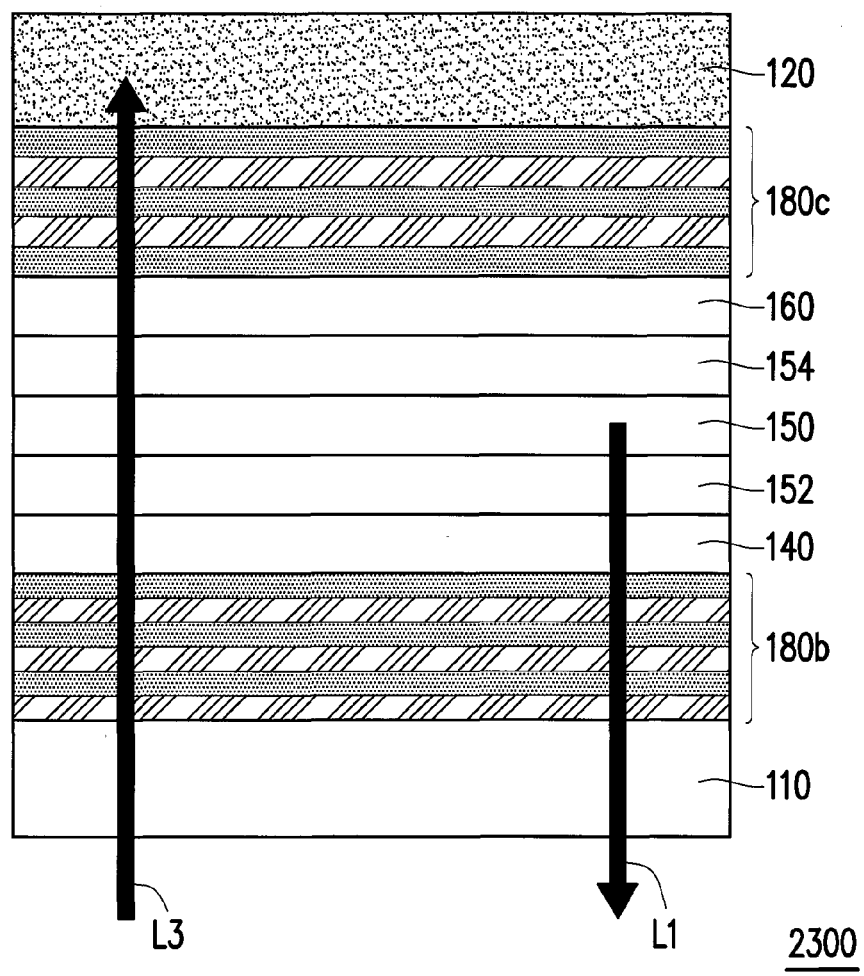
FIG. 23 is a view illustrating a display device according to another embodiment of the disclosure.

FIG. 23 is a view illustrating a display device according to another embodiment of the disclosure. As shown in FIG. 23, a display device 2300 includes a substrate 110, a first anti-reflection layer 180b, a first transparent electrode 140, a first organic layer 152, a light emitting layer 150, a second organic layer 154, a second transparent electrode 160, a second anti-reflection layer 180c, and a light absorption layer 120. The first anti-reflection layer 180b is disposed on the substrate 110. The first transparent electrode 140 is disposed on the first anti-reflection layer 180b, the first organic layer 152 is disposed on the first transparent electrode 140, the light emitting layer 150 is disposed on the first organic layer 152, the second organic layer 154 is disposed on the light emitting layer 150, the second transparent electrode 160 is disposed on the second organic layer 154, the second anti-reflection layer 180c is disposed on the second transparent electrode 160, and the light absorption layer 120 is disposed on the second anti-reflection layer 180c.

The substrate 110 may be formed of glass or plastics, and may be flexible or rigid. Also, the reflectance of the substrate 110 is in a range from 1.4 to 2.2. The first transparent electrode 140 and the second transparent electrode 160 may be respectively an anode and a cathode that provide a current to the light emitting layer 150, so that the light emitting layer 150 may emit a light beam. The materials of the first transparent electrode 140 and the second transparent electrode 160 may include a transparent conductive oxide, such as indium tin oxide (ITO), indium zinc oxide (IZO), or a semi-transparent metal thin film.

The first organic layer 152 and the second organic layer 154 may respectively serve as a hole injection layer, a hole transport layer, a hole blocking layer, or an electron transport layer. Here, the light emitting layer 150 may be any organic light emitting layer suitable for an organic light emitting diode (OLED) display device, or an inorganic light emitting layer (or a quantum dot light emitting layer) suitable for a quantum dot light emitting diode (QLED) display device, for example.

The first anti-reflection layer 180b and the second anti-reflection layer 180c are respectively multi-layer structures, for example. In addition, two or more dielectric materials or metal materials having different refractive indices may be used. Also, thicknesses of the respective layers may be adjusted based on needs, so as to cause destructive interference to the ambient light. Accordingly, the reflection of the ambient light may be reduced to increase the ambient contrast ratio. In this embodiment, the first anti-reflection layer 180a and the second anti-reflection layer 180c may be formed by alternatively stacking two dielectric materials or metal materials having different refractive indices. In addition, the numbers of layers of the first anti-reflection layer 180b and the second anti-reflection layer 180c are different. For example, the first anti-reflection layer 180b has six layers, and the second anti-reflection layer 180c has five layers. However, the numbers of layers of the first anti-reflection layer 180b and the second anti-reflection layer 180c are not limited thereto. In other embodiments, the number of layers of the first anti-reflection layer 180b and the number of layers of the second anti-reflection layer 180c may be the same.

The light absorption layer 120 is black resin, for example, for absorbing external ambient light. Alternatively, the light absorption layer 120 may include a multi-layer structure formed by alternately stacking different layers, such as a low reflectance multi-layer structure formed by alternately stacking a plurality of LiF layers and a plurality of Cr layers.

The light beam L1 emitted from the light emitting layer 150 is transmitted toward the bottom of the drawing. The ambient light L3 passing the respective layers may be absorbed by the light absorption layer 120 with assistance of the first anti-reflection layer 180b and the second anti-reflection layer 180c. When thicknesses of the layers of the first anti-reflection layer 180b and the second anti-reflection layer 180c are optimized, the reflection coefficient of the first anti-reflection layer 180b and the second anti-reflection layer 180c are sufficiently low to substitute for the anti-reflection effect of a circular polarizer. The first anti-reflection layer 180b and the second anti-reflection layer 180c may help reduce the effective refractive index. With the assistance of a substrate with a high refractive index, the efficiencies of direct emission and substrate mode are improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A display device, comprising:
   a substrate;
   a light absorption layer, disposed on the substrate;
   an optical matching layer, disposed on the light absorption layer;
   a first transparent electrode, disposed on the optical matching layer;
   a light emitting layer, disposed on the first transparent electrode; and
   a second transparent electrode, disposed on the light emitting layer, wherein a refractive index of the light absorption layer and a refractive index of the optical matching layer satisfy:

$0.008 < [(n1-n2)/(n1+n2)]^2 < 0.8$, wherein n1 is the refractive index of the light absorption layer, and n2 is the refractive index of the optical matching layer.

2. The display device as claimed in claim 1, wherein the refractive index of the light absorption layer is smaller than the refractive index of the optical matching layer.

3. The display device as claimed in claim 2, wherein the refractive index of the optical matching layer is greater than or equal to 1.8.

4. The display device as claimed in claim 1, further comprising a transflective layer, wherein the optical matching layer is disposed between the transflective layer and the light absorption layer, and a transmittance of the transflective layer is in a range from 40% to 80%.

5. The display device as claimed in claim 1, further comprising an anti-reflection layer disposed on the second transparent electrode.

6. The display device as claimed in claim 1, wherein the light absorption layer comprises a multi-layer structure formed by alternately stacking different layers.

7. The display device as claimed in claim 1, wherein the optical matching layer comprises a multi-layer structure formed by alternately stacking different layers.

8. A display device, comprising:
   a substrate;
   a light absorption layer, disposed on the substrate;
   a transflective electrode, disposed on the light absorption layer;
   a light emitting layer, disposed on the transflective electrode; and
   a transparent electrode, disposed on the light emitting layer, wherein a transmittance of the transflective electrode is in a range from 40% to 80%.

9. The display device as claimed in claim 8, wherein a refractive index of the transflective electrode is in a range from 0.1 to 1.4.

10. The display device as claimed in claim 8, further comprising an optical matching layer disposed between the transflective electrode and the light absorption layer, and a refractive index of the optical matching layer is greater than or equal to 1.8.

11. The display device as claimed in claim 8, wherein the transflective electrode comprises a transparent conductive layer and a transflective metal layer.

12. The display device as claimed in claim 8, further comprising an anti-reflection layer disposed on the transparent electrode.

13. The display device as claimed in claim 8, wherein the light absorption layer comprises a multi-layer structure formed by alternately stacking different layers.

* * * * *